(12) United States Patent
Fukunaga et al.

(10) Patent No.: US 10,991,815 B2
(45) Date of Patent: Apr. 27, 2021

(54) SEMICONDUCTOR DEVICE

(71) Applicant: Sanken Electric Co., Ltd., Niiza (JP)

(72) Inventors: Shunsuke Fukunaga, Niiza (JP); Taro Kondo, Niiza (JP)

(73) Assignee: SANKEN ELECTRIC CO., LTD., Niiza (JP)

(*) Notice: Subject to any disclaimer, the term of this patent is extended or adjusted under 35 U.S.C. 154(b) by 4 days.

(21) Appl. No.: 16/344,817

(22) PCT Filed: Oct. 27, 2016

(86) PCT No.: PCT/JP2016/081929
§ 371 (c)(1),
(2) Date: Apr. 25, 2019

(87) PCT Pub. No.: WO2018/078775
PCT Pub. Date: May 3, 2018

(65) Prior Publication Data
US 2020/0058778 A1 Feb. 20, 2020

(51) Int. Cl.
H01L 29/739 (2006.01)
H01L 29/423 (2006.01)

(52) U.S. Cl.
CPC ...... H01L 29/7394 (2013.01); H01L 29/4236 (2013.01); H01L 29/7397 (2013.01)

(58) Field of Classification Search
CPC ............. H01L 29/7394; H01L 29/4236; H01L 29/7397; H01L 29/7802; H01L 29/513; H01L 29/401; H01L 29/0649; H01L 29/42364; H01L 29/66348; H01L 29/402; H01L 29/06; H01L 29/78
See application file for complete search history.

(56) References Cited

U.S. PATENT DOCUMENTS

| 5,614,749 | A | * | 3/1997 | Ueno | ................ H01L 29/41766 257/330 |
| 2006/0102953 | A1 | * | 5/2006 | Miura | ................ H01L 29/4236 257/330 |
| 2010/0013010 | A1 | * | 1/2010 | Akiyama | ............ H01L 29/1095 257/334 |
| 2011/0133272 | A1 | | 6/2011 | Mauder et al. | |
| 2011/0169103 | A1 | | 7/2011 | Darwish et al. | |
| 2013/0240986 | A1 | * | 9/2013 | Hirler | ............... H01L 29/66734 257/330 |
| 2013/0328121 | A1 | | 12/2013 | Wang et al. | |

FOREIGN PATENT DOCUMENTS

JP 2011-124576 A 6/2011
WO 2011/087994 A2 7/2011

* cited by examiner

Primary Examiner — Galina G Yushina
(74) Attorney, Agent, or Firm — Metrolex IP Law Group, PLLC

(57) ABSTRACT

A semiconductor device includes: a semiconductor base; a trench insulating film which is provided on the inner wall surface of a trench formed from the upper surface of the semiconductor base in a film thickness direction of the semiconductor base and including a charged region which is charged positively; and a gate electrode provided on the trench insulating film within the trench. The positive charge density of the charged region at least in a side part of an outer region of the trench insulating film which is provided on the side surface of the trench is higher than that of an inner region of the trench insulating film which is opposite to the outer region, the outer region being in contact with the semiconductor base.

5 Claims, 5 Drawing Sheets

SEMICONDUCTOR DEVICE

TECHNICAL FIELD

The present invention relates to a semiconductor device with a trench gate structure.

BACKGROUND ART

Various countermeasures to reduce on-state resistance of transistors have been studied. Patent Literature 1 discloses a method for a trench-gate field effect transistor (FET), to distribute positive charges in a region of an insulating film formed within the trench, near the interface between the drift layer and the insulating film, for example. The positive charges form a vertical charge accumulation region along the trench within the drift layer and attract electrons. The on-state resistance can be thereby reduced. The insulating film charged with positive charges may be formed by injecting cesium (Cs) or another electropositive material (e.g., cerium (Ce)) into the insulating film or irradiating the insulating film with electron beams.

CITATION LIST

Patent Literature

[PTL 1] U. S. Unexamined Patent Application No. 2011/0133272 Specification

SUMMARY OF INVENTION

Technical Problem

However, injecting impurities to the insulating film or irradiating the same with electron beams produce defects in the insulating film and reduce the insulation performance of the insulating film. This causes problems including reduction in breakdown voltage of the semiconductor device, an increase in leakage current, and instable electrical characteristics, such as variation in threshold voltage. An object of the present invention is to provide a semiconductor device having low on-voltage, high breakdown voltage, and stable electrical characteristics.

Solution to Problem

According to an aspect of the present invention, a semiconductor device is provided, which includes: a semiconductor base; a trench insulating film which is provided on the inner wall surface of a trench formed from the upper surface of the semiconductor base in a film thickness direction of the semiconductor base and including a charged region that is charged positively; and a gate electrode provided on the trench insulating film within the trench. The positive charge density of the charged region at least in a side part of an outer region of the trench insulating film which is provided on the side surface of the trench is higher than that of an inner region of the trench insulating film which is opposite to the outer region, the outer region being in contact with the semiconductor base.

Advantageous Effects of Invention

According to the present invention, it is possible to provide a semiconductor device having low on-voltage, high breakdown voltage, and stable electrical characteristics.

DESCRIPTION OF EMBODIMENT

Figure 1:
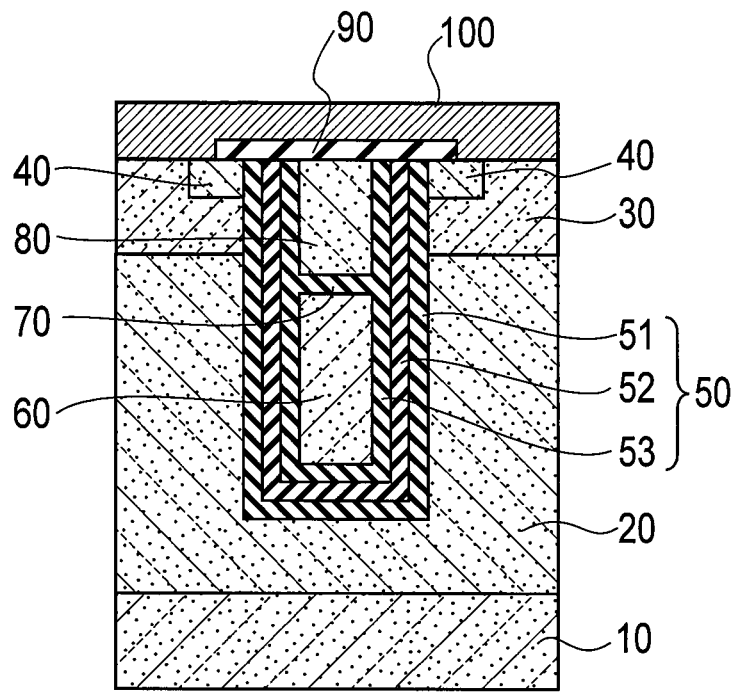
FIG. 1 is a schematic cross-sectional view illustrating the structure of a semiconductor device according to an embodiment of the present invention.

Next, a description is given of an embodiment of the present invention with reference to the drawings. In the drawings, the same of similar portions are given the same or similar reference numerals. The drawings are schematic, and it should be noted that the relationship between thickness and planar dimensions, the ratio in length of each component, and the like are different from real ones. Specific dimensions should be determined with reference to the following description. It is also obvious that the dimensional relationship or proportions of some portions are different from each other between the drawings.

The following embodiment illustrates devices and methods to embody the technical idea of the present invention. The technical idea of the present invention will not specify shapes, structures, arrangement, and the like of the constituent components to those described below. The embodiment of the present invention can be variously changed within the claims.

A semiconductor device according to the embodiment of the present invention includes a semiconductor base including semiconductor films laid as illustrated in FIG. 1. The semiconductor base includes: an n-type drain region 20 provided on an n-type semiconductor substrate 10; a p-type base region 30 provided on the drain region 20; and an n-type source region 40 provided on the base region 30. A trench insulating film 50 is provided on an inner wall surface of a trench that extends from the upper surface of the source region 40 and penetrates the source region 40 and base region 30. The end of the trench reaches the drain region 20.

Within the trench extended from the upper surface in a film thickness direction of the semiconductor base, a vertical field plate (VFP) electrode 60 is embedded in the lower half while a gate electrode 80 is embedded in the upper half. The gate electrode 80 is provided in a region opposite to the base region 30. The semiconductor device illustrated in FIG. 1 is an FET with a trench gate structure. On the surface of the base region 30, which is opposite to the gate electrode 80 with the trench insulting film 50 interposed therebetween, a channel is formed when the semiconductor device is in the on-state.

On the upper surface of the gate electrode 80, an interlayer insulating film 90 is provided. On the interlayer insulating film 90, a source electrode 100 connecting to the source region 40 and base region 30 is formed.

The VFP electrode 60 is electrically connected to the source region 40. The VFP electrode 60 functions as a field plate when the semiconductor device is in the off-state and well expands the depletion layer from the trench into the drain region 20. The VFP electrode 60 is provided below the base region 30, and the VFP electrode 60 and gate electrode 80 are isolated and separated from each other by a separation insulating film 70.

The gate electrode 80 and VFP electrode 60 are made of a polysilicon film. The trench insulating film 50 is made of a silicon oxide film, a silicon nitride film, or the like. The trench insulating film 50 is formed by thermal oxidation, chemical vapor deposition (CVD), or the like, for example. The semiconductor base is a semiconductor film, such as a silicon film.

As illustrated in FIG. 1, the trench insulating film 50 has a structure in which an outer charged region 51, an uncharged region 52, and an inner charged region 53 are laid on each other. The outer charged region 51 is in contact with the semiconductor base, and the inner charged region 53 is opposite to the outer charged region 51 with the uncharged region 52 interposed therebetween. The outer and inner charged regions 51 and 53 are positively-charged regions including fixed charges. In the trench insulating film 50 illustrated in FIG. 1, the entire outer region in contact with the semiconductor base and the entire inner region opposite to the outer region are charged regions. The positive charge density of the outer charged region 51 is set higher than that of the inner charged region 53.

According to the semiconductor device illustrated in FIG. 1, electrons attracted by the positive charges in the outer charged region 51 form a vertical charge accumulation region along the trench within the semiconductor base. This reduces the on-state resistance of the semiconductor device.

The inner charged region 53 of the trench insulating film 50 has a lower positive charge density than that of the outer charged region 51. This prevents electrons within the gate electrode 80 from being attracted by the trench insulating film 50 and being unevenly distributed within the gate electrode 80. It is therefore possible to reduce variation in gate resistance and stabilize the potential characteristics.

The charged regions of the trench insulating film 50 preferably have the same positive charge density on both sides of the trench. This reduces variation in characteristics of the semiconductor devices. The bottom surface of the trench preferably does not reach the semiconductor substrate 10. When the bottom surface of the trench is located within the drain region 20 having an impurity concentration lower than that of the semiconductor substrate 10, the depletion layer is more likely to extend downward from the bottom surface of the trench when the semiconductor device is in the off-state. This can increase the breakdown voltage.

As described above, in the semiconductor device according to the embodiment of the present invention, the trench insulating film 50 includes the charged regions including positive charges, and the charge accumulation region is thereby formed within the semiconductor base. The semiconductor device therefore includes low on-voltage, high breakdown voltage, and stable electrical characteristics.

With reference to the drawings, a description is given of a method of manufacturing the semiconductor device according to the embodiment of the present invention below. The manufacturing method illustrated below is just an example. It is obvious that the manufacturing method can be implemented with various manufacturing processes other than the method described below, including modifications thereof.

Figure 2:
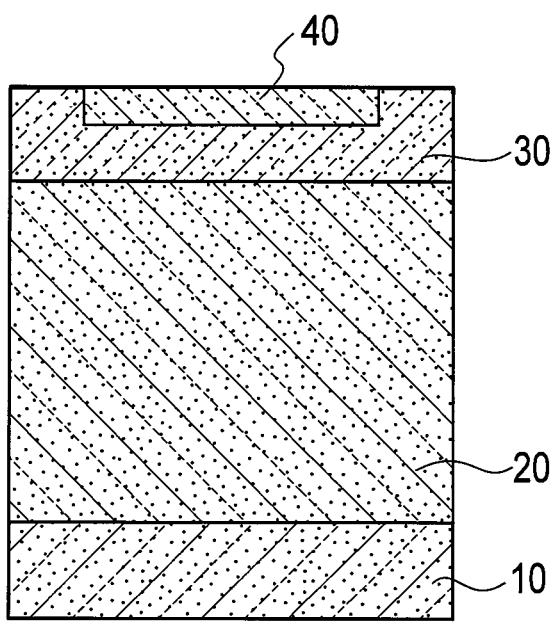
FIG. 2 is a schematic process cross-sectional view (No. 1) for explaining a method of manufacturing the semiconductor device according to the embodiment of the present invention.

As illustrated in FIG. 2, the n-type drain region 20 and p-type base region 30 are laid on the n-type semiconductor substrate 10, and the n-type source region 40 is formed on a part of the upper surface of the base region 30. The source region 40 is formed by using ion injection and diffusion, for example.

Figure 3:
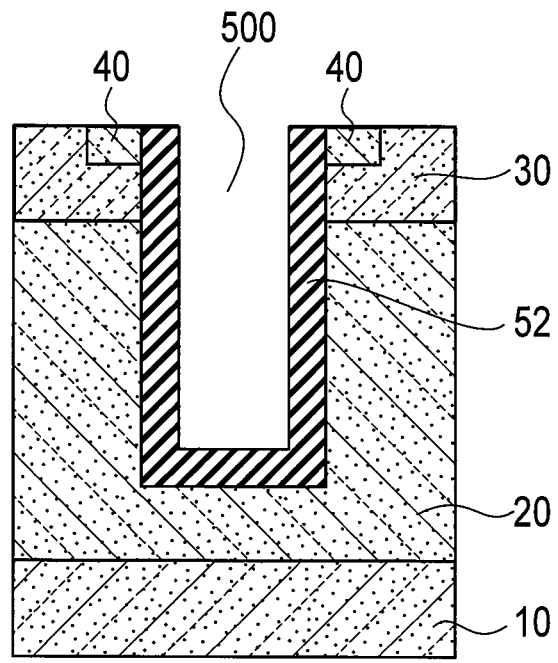
FIG. 3 is a schematic process cross-sectional view (No. 2) for explaining the method of manufacturing the semiconductor device according to the embodiment of the present invention.

Next, a trench 500 is formed by photolithography and etching as illustrated in FIG. 3. For example, using a mask including an opening positioned above the source region 40, the trench 500 is formed, which extends from the upper surface of the source region 40 and penetrates the source and base regions 40 and 30 with the end thereof located in the drain region 20. On the inner wall surface of the trench 500, the uncharged region 52 is formed as a part of the trench insulating film 50. For example, a silicon oxide film is formed by thermal oxidation.

Figure 4:
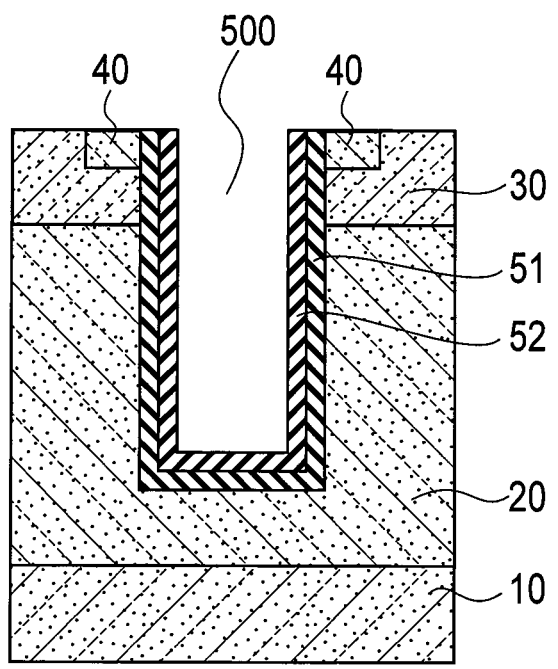
FIG. 4 is a schematic process cross-sectional view (No. 3) for explaining the method of manufacturing the semiconductor device according to the embodiment of the present invention.

Subsequently, as illustrated in FIG. 4, a region of the trench insulating film 50 which is in contact with the semiconductor base is formed into the outer charged region 51, which is charged positively. For example, light ion irradiation using helium ions, protons, and the like is performed to form a positively-charged region in a region adjacent to the semiconductor base within the uncharged region 52. The outer charged region 51 having a film thickness of about 20 nm and a positive charge density of about $5 \times 10^{13}/cm^2$ is thereby formed.

Figure 5:
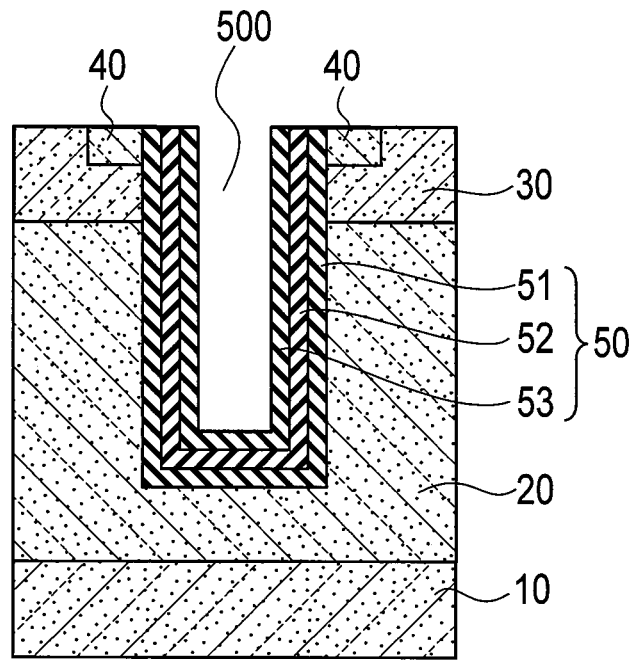
FIG. 5 is a schematic process cross-sectional view (No. 4) for explaining the method of manufacturing the semiconductor device according to the embodiment of the present invention.

Next, as illustrated in FIG. 5, the inner charged region 53 is formed on the uncharged region 52. For example, light ion irradiation is performed for an oxide silicon film formed by thermal oxidation to form the inner charged region 53 having a film thickness of about 20 nm and a positive charge density of about $5 \times 10^3$ $cm^2$.

The trench insulating film 50 has a total film thickness of about 50 to 100 nm since the trench insulating film 50 serves as a gate insulating film. The thickness of the bottom part of the trench insulating film 50 may be greater than that of the side part. The thickness of the bottom part may be thicker than 50 to 100 nm.

The charged regions are suitably composed of an oxide film with phosphor (P) or arsenic (AS) distributed therein, for example. Especially in an oxide film with phosphor distributed, the amount of fixed positive charges in the charged regions can be increased.

Figure 6:
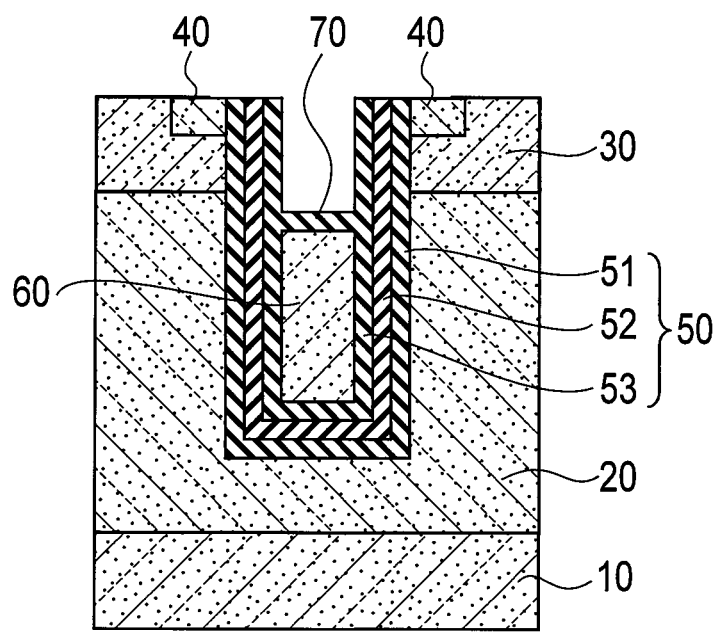
FIG. 6 is a schematic process cross-sectional view (No. 5) for explaining the method of manufacturing the semiconductor device according to the embodiment of the present invention.
Figure 7:
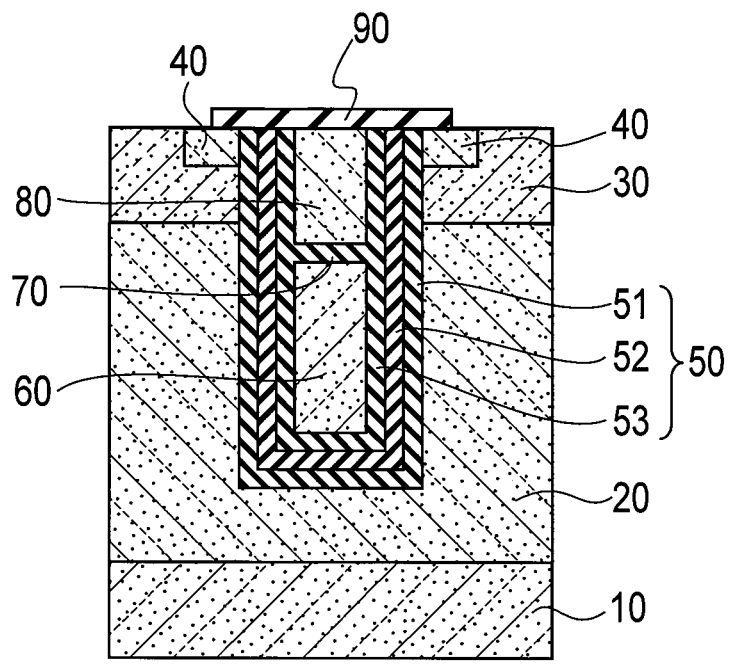
FIG. 7 is a schematic process cross-sectional view (No. 6) for explaining the method of manufacturing the semiconductor device according to the embodiment of the present invention.

Thereafter, as illustrated in FIG. 6, the VFP electrode 60 is embedded in the lower half of the trench 500, and the separation insulating film 70 is formed on the upper surface of the VFP electrode 60. The upper half of the trench 500 is filled to form the gate electrode 80 on the separation insulating film 70. As illustrated in FIG. 7, the interlayer insulating film 90 is then formed on the gate electrode 80. Subsequently, the source electrode 100 connecting to the source and base regions 40 and 30 is formed on the interlayer insulating film 90. In such a manner, the semiconductor device illustrated in FIG. 1 is completed.

As described above, with the method of manufacturing the semiconductor device according to the embodiment of the present invention, the positive charge density in the outer charged region 51 can be set high while the positive charge density in the inner charged region 53 of the trench insulating film 50, which is in contact with the gate electrode 80, is set low. It is therefore possible to prevent electrons within the gate electrode 80 from being unevenly distributed while forming the charge accumulation region within the semiconductor base to reduce the on-state resistance.

The above description illustrates the method of forming the outer charged region 51 by light ion irradiation. However, plasma CVD, for example, may be used to form a positively charged film on the inner wall surface of the trench 500 as the outer charged region 51, followed by formation of the uncharged region 52 on the outer charged region 51. The inner charged region 53 may be formed by diffusing charges from the gate electrode 80 to the surface of the uncharged region 52.

<First Modification>

Figure 8:
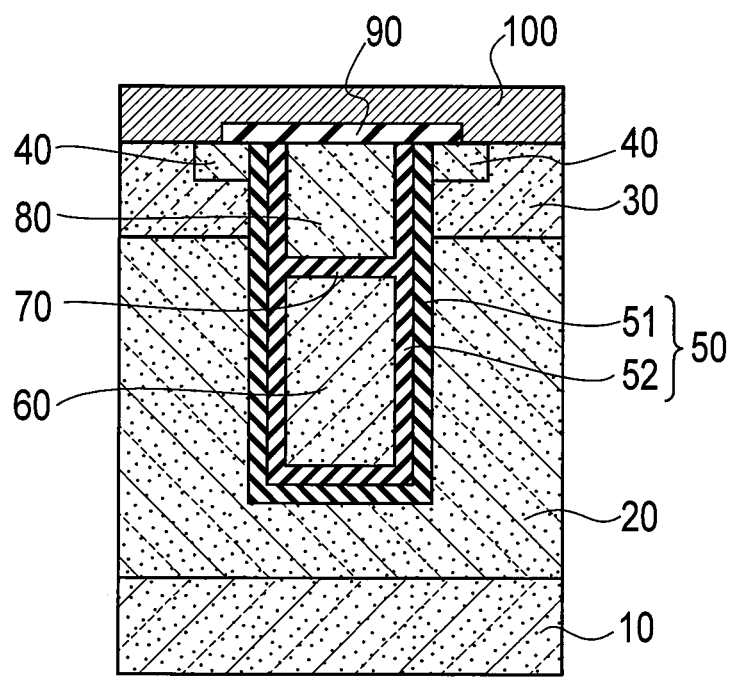
FIG. 8 is a schematic cross-sectional view illustrating the structure of a semiconductor device according to a first modification of the embodiment of the present invention.

The lower the positive charge density of the inner region of the trench insulating film 50 which is in contact with the gate electrode 80, the more likely it is to reduce uneven distribution of electrons in the gate electrode 80. As illustrated in FIG. 8, the trench insulating film 50 may have a two-layer structure including the outer charged region 51, which is charged positively, and the uncharged region 52. When the uncharged region 52, which is not charged positively, is provided as the inner region of the trench insulating film 50 in such a manner, reduction in interaction between the charged region of the trench insulating film 50 and electrons in the gate electrode 80 further stabilizes the potential characteristics of the semiconductor device.

<Second Modification>

Figure 9:
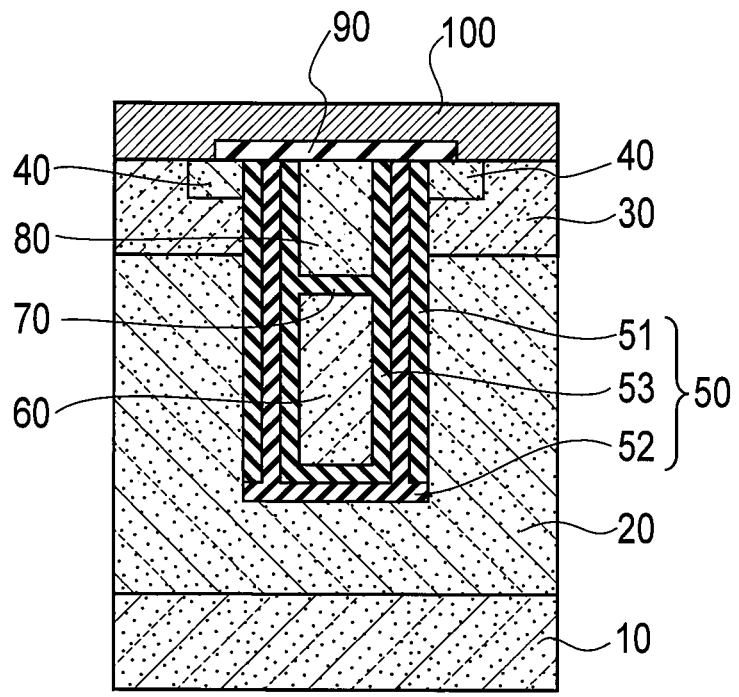
FIG. 9 is a schematic cross-sectional view illustrating the structure of a semiconductor device according to a second modification of the embodiment of the present invention.

In a semiconductor device according to a second modification of the embodiment of the present invention, as illustrated in FIG. 9, a charged region is formed in a side part of the outer region of the trench insulating film 50 which is located on the side surface of the trench. On the other hand, any charged region is not formed in the bottom part of the outer region of the trench insulating film 50 which is located on the bottom of the trench. The outer region is therefore not charged positively in the bottom of the trench.

According to the semiconductor device illustrated in FIG. 9, therefore, the depletion layer is more likely to extend downward from the bottom of the trench when the semiconductor device is in the off-state. This can increase the breakdown voltage of the semiconductor device. Similarly to the embodiment illustrated in FIG. 8, the trench insulating film 50 of the second modification may have a two-layer structure including the outer charged region 51 and the uncharged region 52.

<Third Modification>

Figure 10:
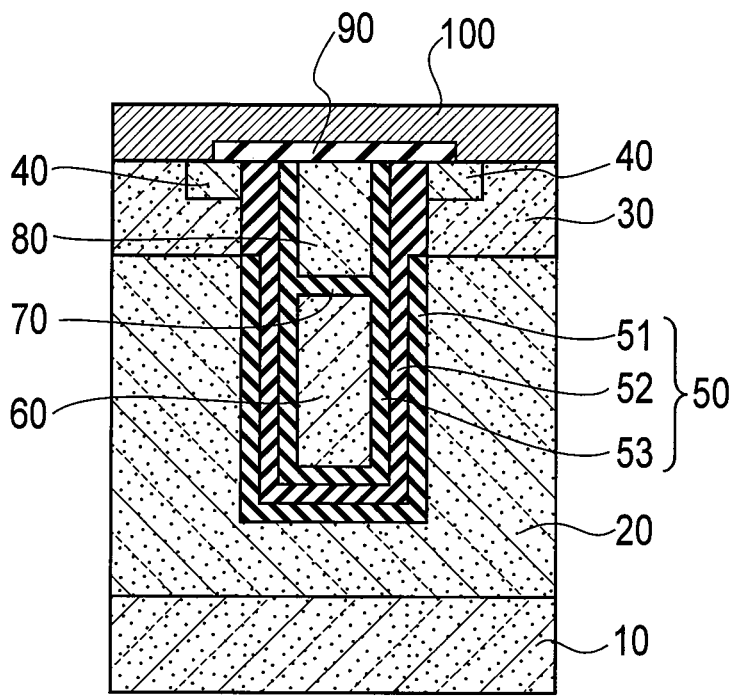
FIG. 10 is a schematic cross-sectional view illustrating the structure of a semiconductor device according to a third modification of the embodiment of the present invention.

In a semiconductor device according to a third modification of the embodiment of the present invention, as illustrated in FIG. 10, a region opposite to the base region 30 in a side part of the outer region of the trench insulating film 50 which is located on the side surface of the trench is not charged positively. In other words, only the region opposite to the drain region 20 in the side part of the outer region of the trench insulating film 50 is charged.

When positive charges are not included in the region opposite to the base region 30 in the outer region of the trench insulating film 50, the charge accumulation region is not formed in the base region 30. This stabilizes the threshold voltage of the semiconductor device. Similarly to the embodiment illustrated in FIG. 8, the trench insulating film 50 of the third modification may have a two-layer structure including the outer charged region 51 and the uncharged region 52. Similarly to the embodiment illustrated in FIG. 9, the semiconductor device of the third modification may be configured not to include a charged region in the bottom part of the trench insulating film 50.

OTHER EMBODIMENTS

As described above, the present invention is illustrated by the embodiment. However, it should not be understood that the description and drawings constituting a part of the disclosure limit the present invention. Based on the disclosure, those skilled in the art will appreciate various substitutions, examples, and operation techniques.

In the case illustrated in the description of the embodiment above, the gate electrode 80 is made of a polysilicon film. However, the gate electrode 80 may be made of a metallic film, such as an aluminum (Al) film or a titanium (Ti) film, instead of a polysilicon film. Using a metallic film including free electrons inside prevents uneven distribution of electrons within the gate electrode 80 and stabilizes the potential characteristics. In addition, the above description illustrates an example in which the VFP electrode 60 is formed in the lower half of the trench. However, the application is also applicable to a semiconductor device in which the gate electrode 80 is embedded so as to fill the entire trench.

The above description illustrates the case where the semiconductor device is an FET. However, the application is applicable to other semiconductor devices with a trench gate structure. For example, in an insulating gate-type bipolar transistor (IGBT), the positive charge density of the outer charged region 51 in a part of the trench insulating film 50 which is opposite to a drift region is set higher than that of the inner charged region 53. This reduces the on-state resistance of the IGBT while stabilizing the potential characteristics.

As described above, it is obvious that the present invention includes various embodiments not described herein and the like. The technical scope of the present invention is determined only by the features according to the claims proper from the above description.

INDUSTRIAL APPLICABILITY

The semiconductor device of the present invention is applicable to semiconductor devices of a trench gate structure.

The invention claimed is:
1. A semiconductor device, comprising:
a semiconductor base;
a trench insulating film which is provided on an inner wall surface and a bottom of a trench formed from an upper surface of the semiconductor base in a thickness direction of the semiconductor base and includes a positively charged region, the trench insulating film having a structure comprising an outer charged region, an uncharged region, and an inner charged region, in which the outer charge region is disposed at least on portions of the inner wall surface and on the bottom of the trench, the uncharged region is disposed on the outer charged region, and an inner charged region is disposed on the uncharged region; and a gate electrode provided on the trench insulating film within the trench, wherein a positive charge density of the charged region at least in a side part of the outer charged region of the trench insulating film which is provided on the inner wall surface of the trench is higher than that of the inner charged region of the trench insulating film which is opposite to the outer charge region, the outer charged region being in contact with the semiconductor base.

2. The semiconductor device according to claim 1 and further comprising: a separation insulating film formed within the trench parallel to the bottom of the trench and contacting opposite sides of the inner charged region, wherein the gate electrode is disposed on the separation insulating film within the trench and a field plate electrode is disposed under the separation insulating film within the trench.

3. A semiconductor device, comprising:

a semiconductor base;

a trench insulating film including a positively charged region provided on an inner wall surface and a bottom of a trench formed from an upper surface of the semiconductor base in a thickness direction of the semiconductor base, the trench insulating film having a structure comprising an outer charged region contacting the semiconductor base and disposed along the inner wall surface of the trench, an uncharged region disposed on the outer charged region and on the bottom of the trench, and an inner charged region disposed on the uncharged region; and a gate electrode provided on the trench insulating film within the trench, wherein a positive charge density of the charged region at least in a side part of the outer charged region contacting the semiconductor base is higher than that of the inner charged region disposed opposite to the side part of the outer charge region.

4. The semiconductor device according to claim 1, wherein the semiconductor device comprises an n-type drain region;

the semiconductor base comprises a p-type base region provided on the drain region;

an n-type source region provided in the base region, and the trench extends from an upper surface of the source region and penetrates the source region and the semiconductor base, and the bottom surface of the trench is located in the drain region.

5. The semiconductor device according to claim 4, wherein a portion of the uncharged region abuts the semiconductor base region in an area adjacent to a side part of the outer charge region of the trench insulating film.

* * * * *